US011043402B2

United States Patent
Kosugi et al.

(10) Patent No.: US 11,043,402 B2
(45) Date of Patent: Jun. 22, 2021

(54) COOLING UNIT, HEAT INSULATING STRUCTURE, AND SUBSTRATE PROCESSING APPARATUS

(71) Applicant: KOKUSAI ELECTRIC CORPORATION, Tokyo (JP)

(72) Inventors: Tetsuya Kosugi, Toyama (JP); Hitoshi Murata, Toyama (JP); Masaaki Ueno, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 283 days.

(21) Appl. No.: 16/127,292

(22) Filed: Sep. 11, 2018

(65) Prior Publication Data
US 2019/0080941 A1    Mar. 14, 2019

(30) Foreign Application Priority Data

Sep. 12, 2017 (JP) ............................. JP2017-174738
Jul. 24, 2018 (JP) ............................. JP2018-138160

(51) Int. Cl.
*F27B 5/16* (2006.01)
*F27D 9/00* (2006.01)
(Continued)

(52) U.S. Cl.
CPC .... *H01L 21/67109* (2013.01); *F27B 17/0025* (2013.01); *F27D 9/00* (2013.01); *F27D 2009/0005* (2013.01)

(58) Field of Classification Search
None
See application file for complete search history.

(56) References Cited

U.S. PATENT DOCUMENTS 5,097,890 A * 3/1992 Nakao ..................... C30B 25/10
                                                                118/724
6,403,927 B1    6/2002 Kato
(Continued)

FOREIGN PATENT DOCUMENTS

JP      04-065820 A    3/1992
JP      07-058030 A    3/1995
(Continued)

OTHER PUBLICATIONS

Taiwanese Office Action dated Sep. 19, 2019 for the Taiwanese Patent Application No. 107128422.
(Continued)

*Primary Examiner* — Joseph M. Pelham
(74) *Attorney, Agent, or Firm* — Volpe Koenig

(57) ABSTRACT

There is provided a cooling unit, comprising: an intake pipe provided for each of a plurality of zones and configured to supply a gas for cooling a reaction tube; a control valve provided in the intake pipe and configured to adjust a flow rate of the gas; a buffer part configured to temporarily store the gas supplied from the intake pipe; and openings provided so as to blow the gas stored in the buffer part toward the reaction tube, wherein the flow rate of the gas introduced into the intake pipe is set according to vertical length ratios of the zones such that the flow rate and a flow velocity of the gas injected from the openings toward the reaction tube are adjusted by opening and closing the control valve.

11 Claims, 9 Drawing Sheets

(51) Int. Cl.
    *H01L 21/67* (2006.01)
    *F27B 17/00* (2006.01)

(56) References Cited

U.S. PATENT DOCUMENTS

| | | | |
|---|---|---|---|
| 8,253,075 B2 | 8/2012 | Kobayashi et al. | |
| 8,501,599 B2* | 8/2013 | Ueno | C23C 16/46 |
| | | | 438/509 |
| 8,507,296 B2* | 8/2013 | Ueno | C23C 16/46 |
| | | | 438/5 |
| 9,255,736 B2* | 2/2016 | Yoshii | H01L 21/67248 |
| 9,587,884 B2* | 3/2017 | Kosugi | F27D 9/00 |
| 2002/0025688 A1 | 2/2002 | Kato | |
| 2009/0014435 A1* | 1/2009 | Hayashida | H01L 21/67248 |
| | | | 219/531 |
| 2009/0029486 A1* | 1/2009 | Ueno | C23C 16/46 |
| | | | 438/5 |
| 2011/0223693 A1 | 9/2011 | Sugishita | |
| 2012/0064472 A1 | 3/2012 | Yoshii et al. | |
| 2012/0223066 A1 | 9/2012 | Yoshii et al. | |
| 2013/0065189 A1 | 3/2013 | Yoshii et al. | |
| 2014/0238972 A1 | 8/2014 | Yoshii et al. | |
| 2014/0287375 A1 | 9/2014 | Kosugi et al. | |
| 2015/0093909 A1 | 4/2015 | Murata et al. | |
| 2015/0370245 A1* | 12/2015 | Sugishita | H01L 21/67109 |
| | | | 700/121 |
| 2018/0120822 A1* | 5/2018 | Asai | G05B 19/4184 |
| 2019/0276938 A1* | 9/2019 | Sugishita | H01L 21/02 |

FOREIGN PATENT DOCUMENTS

| | | |
|---|---|---|
| JP | 09-190982 A | 7/1997 |
| JP | 2002-075890 A | 3/2002 |
| JP | 2004-119804 A | 4/2004 |
| JP | 2011-216854 A | 10/2011 |
| JP | 2012-182310 A | 9/2012 |
| JP | 2013-062361 A | 4/2013 |
| JP | 2014-209569 A | 11/2014 |
| KR | 20120026452 A | 3/2012 |
| KR | 20140116796 A | 10/2014 |
| WO | 2008/099449 A1 | 8/2008 |
| WO | 2018/105113 A1 | 6/2018 |

OTHER PUBLICATIONS

Korean Office Action dated Oct. 29, 2019 for the Korean Patent Application No. 10-2018-0107701.
Korean Office Action dated Jul. 1, 2020 for Korean Patent Application No. 10-2020-0053407.
Japanese Office Action dated Mar. 3, 2020 for the Japanese Patent Application No. 2018-138160.

* cited by examiner

COOLING UNIT, HEAT INSULATING STRUCTURE, AND SUBSTRATE PROCESSING APPARATUS

CROSS-REFERENCE TO RELATED APPLICATION

This application is based upon and claims the benefit of priority from Japanese Patent Application No. 2017-174738, filed on Sep. 12, 2017, and Japanese Patent Application No. 2018-138160, filed on Jul. 24, 2018, the entire contents of which are incorporated herein by reference.

TECHNICAL FIELD

The present disclosure relates to a cooling unit, a heat insulating structure and a substrate processing apparatus.

BACKGROUND

A semiconductor manufacturing apparatus is known as an example of a substrate processing apparatus, and a vertical type apparatus is known as an example of a semiconductor manufacturing apparatus. In the vertical type apparatus, a boat as a substrate holding part for holding a plurality of substrates (hereinafter also referred to as "wafers") in multiple stages is loaded into a process chamber in a reaction tube while holding the substrates, and the substrates are processed at a predetermined temperature while the temperature of the substrates is controlled in a plurality of zones. In the conventional heater temperature control, a heater is turned off at the time of lowering the temperature. However, in recent years, a cooling gas is supplied from a cooling mechanism to actively improve the temperature lowering characteristic after substrate processing.

In the related art, there is known a technique of changing a flow of a cooling gas at the time of film formation, temperature lowering, and temperature recovery by opening and closing an opening/closing valve. Further, in the related art, there is known a technique of setting the temperature lowering speed of each portion of a heater by changing the number and arrangement of blowing holes. However, in the control of the flow rate of the cooling gas using the cooling unit configuration described above, the reaction tube cannot be uniformly cooled during the rapid cooling. Therefore, there is a problem that a change in a speed of lowering the temperature is different for each zone, and a difference occurs in the temperature history between zones.

SUMMARY

The present disclosure provides some embodiments of a configuration capable of improving a responsiveness of heating control and cooling control between zones.

According to one embodiment of the present disclosure, there is provided a configuration, including: an intake pipe provided for each of a plurality of zones and configured to supply a gas for cooling a reaction tube; a control valve provided in the intake pipe and configured to adjust a flow rate of the gas; a buffer part configured to temporarily store the gas supplied from the intake pipe; and an opening provided so as to blow the gas stored in the buffer part toward the reaction tube, wherein the flow rate of the gas introduced into the intake pipe is set according to vertical length ratios of the zones such that the flow rate and a flow velocity of the gas injected from the opening toward the reaction tube are adjusted by opening and closing the control valve.

DETAILED DESCRIPTION

One embodiment of the present disclosure will now be described in detail with reference to the drawings.

Figure 1:
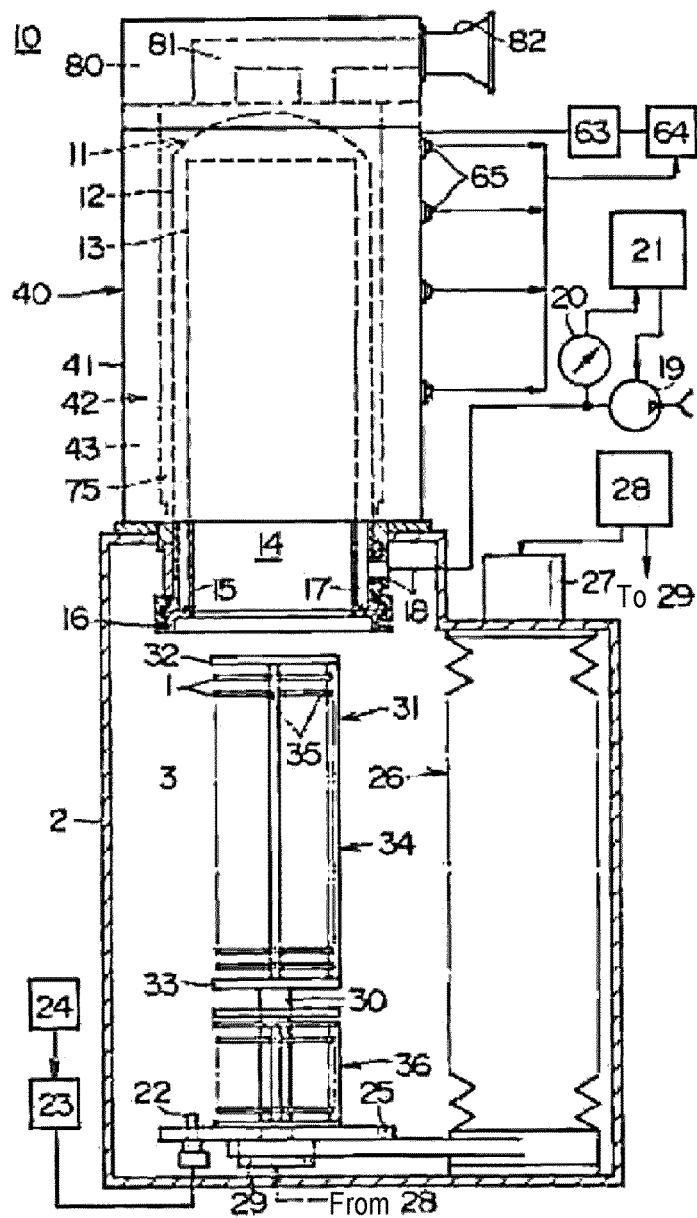
FIG. 1 is a partially cutaway front view showing a substrate processing apparatus according to one embodiment of the present disclosure.
Figure 2:
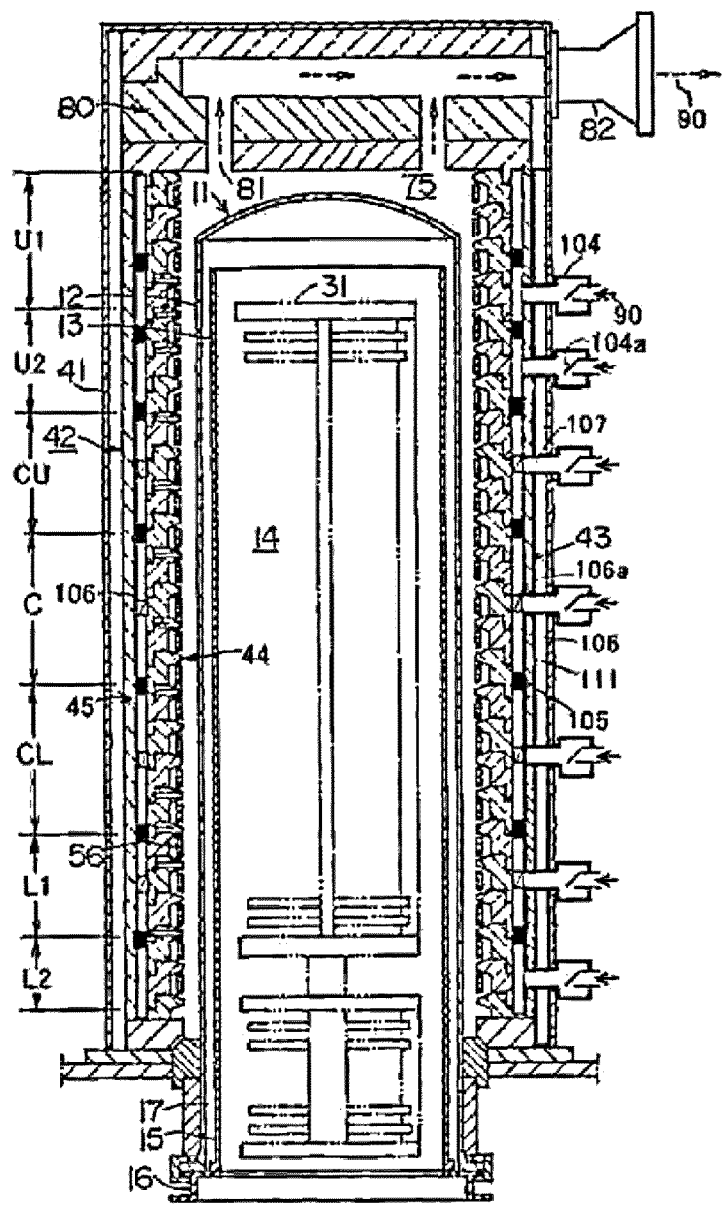
FIG. 2 is a front sectional view of the substrate processing apparatus according to one embodiment of the present disclosure.

In the present embodiment, as shown in FIGS. 1 and 2, the substrate processing apparatus 10 according to the present disclosure is configured as a processing apparatus 10 that performs a film-forming process in a method of manufacturing a semiconductor device.

The substrate processing apparatus 10 shown in FIG. 1 includes a process tube 11 as a supported vertical reaction tube, and the process tube 11 includes an outer tube 12 and an inner tube 13 arranged concentrically with each other. The outer tube 12 is made of quartz ($SiO_2$) and is integrally molded into a cylindrical shape with its upper end closed and its lower end opened. The inner tube 13 is formed into a cylindrical shape with its upper and lower ends opened. A cylindrical hollow portion of the inner tube 13 forms a process chamber 14 into which a boat to be described later is loaded, and the lower end opening of the inner tube 13 forms a furnace opening 15 through which a boat is loaded and unloaded. As will be described later, a boat 31 is configured to hold a plurality of wafers aligned vertically. Therefore, an inner diameter of the inner tube 13 is set to be larger than a maximum outer diameter (e.g., 300 mm) of a wafer 1 to be handled.

The lower end portion between the outer tube 12 and the inner tube 13 is air-tightly sealed by a manifold 16 constructed in a substantially cylindrical shape. For replacement or the like of the outer tube 12 and the inner tube 13, the manifold 16 is detachably attached to the outer tube 12 and the inner tube 13, respectively. By supporting the manifold 16 on a housing 2 of a CVD apparatus, the process tube 11 is vertically installed. Hereinafter, only the outer tube 12 may be shown as the process tube 11 in the drawings.

An exhaust path 17 is formed by a gap between the outer tube 12 and the inner tube 13 so that a cross section thereof has a circular ring with a constant width. As shown in FIG. 1, one end of an exhaust pipe 18 is connected to the upper portion of the side wall of the manifold 16, and the exhaust pipe 18 is in communication with the lowermost end portion of the exhaust path 17. An exhaust device 19 controlled by a pressure controller 21 is connected to the other end of the exhaust pipe 18, and a pressure sensor 20 is connected to an intermediate portion of the exhaust pipe 18. The pressure controller 21 is configured to feedback-control the exhaust device 19 based on a measurement result from the pressure sensor 20.

A gas introduction pipe 22 is disposed below the manifold 16 so as to communicate with a furnace port 15 of the inner tube 13, and a gas supply device 23 for supplying a precursor gas and an inert gas is connected to the gas introduction pipe 22. The gas supply device 23 is configured to be controlled by a gas flow rate controller 24. The gas introduced into the furnace port 15 from the gas introduction pipe 22 flows through the process chamber 14 of the inner tube 13 and passes through the exhaust path 17. The gas is exhausted by the exhaust pipe 18.

A seal cap 25 which closes the lower end opening of the manifold 16 is configured to make contact with the manifold 16 from the lower side in the vertical direction. The seal cap 25 is formed in a disk shape so as to have a diameter substantially equal to an outer diameter of the manifold 16 and is configured to be raised and lowered in the vertical direction by a boat elevator 26 installed in a standby chamber 3 of the housing 2. The boat elevator 26 includes a motor-driven feed screw shaft device, a bellows and the like. A motor 27 of the boat elevator 26 is configured to be controlled by a drive controller 28. A rotary shaft 30 is arranged on a center line of the seal cap 25 and is supported in a rotatable manner. The rotary shaft 30 is configured to be rotationally driven by a rotation mechanism 29 as a motor controlled by the drive controller 28. A boat 31 is vertically supported at an upper end of the rotary shaft 30.

The boat 31 includes a pair of end plates 32 and 33 at the top and bottom thereof and three holding members 34 vertically provided between the end plates 32 and 33. A larger number of holding grooves 35 are formed in the three holding members 34 at equal intervals in the longitudinal direction. The holding grooves 35, 35 and 35 formed at the same stage in the three holding members 34 are opened so as to face each other. As the wafer 1 is inserted between the holding grooves 35 of the same stage of the three holding members 34, the boat 31 is configured to horizontally hold a plurality of wafers 1 with their centers aligned with each other. A heat insulating cap part 36 is disposed between the boat 31 and the rotary shaft 30. The rotary shaft 30 is configured to support the boat 31 in a lifted state from the upper surface of the seal cap 25 so that the lower end of the boat 31 is spaced apart from the position of the furnace port 15 by an appropriate distance. The heat insulating cap part 36 is configured to insulate the vicinity of the furnace port 15.

At the outside of the process tube 11, a heater unit 40 as a heating device is arranged concentrically and is installed in a state in which the heater unit 40 is supported by the housing 2. The heating device 40 is provided with a case 41. The case 41 is made of stainless steel (SUS) and is formed in a tubular shape, or a cylindrical shape in some embodiments, with its lower end opened and its upper end closed. An inner diameter and an overall length of the case 41 are set larger than an outer diameter and an overall length of the outer tube 12. In the present embodiment, the heating device 40 is divided into seven control zones U1, U2, CU, C, CL, L1 and L2 as a plurality of heating zones (heating control zones) from the upper end side to the lower end side.

Inside the case 41, there is installed a heat insulating structure 42 which is an embodiment of the present disclosure. The heat insulating structure 42 according to the present embodiment is formed in a tubular shape, or a cylindrical shape in some embodiments, and a side wall part 43 of the cylindrical body is formed in a multilayer structure. That is, the heat insulating structure 42 includes a side wall outer layer 45 disposed on the outer side of the side wall part 43 and a side wall inner layer 44 disposed on the inner side of the side wall part 43. Between the side wall outer layer 45 and the side wall inner layer 44, there are provided partition parts 105 for separating the side wall part 43 into a plurality of zones (regions) in the vertical direction, and circular buffers 106 as buffer parts installed between the partition parts 105.

Furthermore, the buffer parts 106 are configured to be divided into a plurality of portions by partition parts 106a as slits depending on the length thereof. That is, there are provided the partition parts 106a for dividing the buffer parts 106 into a plurality of portions depending on the length of a zone. In the present specification, the partition parts 105 are also referred to as first partition parts 105, and the partition parts 106a are also referred to as second partition parts 106a. Furthermore, the partition parts 105 may also be referred to as isolation parts for separating a plurality of cooling zones. The control zones CU, C, CL, L1 and L2 and the buffer parts 106 are provided so as to face each other. The height of the respective control zones and the height of the buffer parts 106 are substantially the same. On the other hand, the height of the control zones U1 and U2 disposed on the upper side and the height of the buffer parts 106 opposed to these control zones are different from each other. Specifically, the height of the buffer parts 106 opposed to the control zones U1 and U2 is set to be lower than the height of the respective zones. Therefore, it is possible to efficiently supply a cooling air 90 to the respective control zones. As a result, the cooling air 90 supplied to the control zones U1 and U2 can be made equal to the cooling air 90 supplied to other control zones. Temperature control as in the control zones CU, C, CL, L1 and L2 can also be performed in the control zones U1 and U2.

In particular, since the height of the buffer part 106 facing the control zone U1 for heating an internal space 75 on the side of an exhaust duct 82 is set smaller than ½ of the height of each zone, it is possible to efficiently supply the cooling air 90 to the control zone U1. Thus, even in the control zone U1 nearest to the exhaust side, it is possible to perform the same temperature control as in other control zones.

Further, the partition part 105 arranged in the highest portion is located at a position higher than the substrate processing region of the boat 31 and lower than the height of the process tube 11 (at a position substantially the same as the height of the inner tube 13). The partition part 105 arranged in the second highest portion is located at substantially the same height position as the wafer 1 mounted on the upper end portion of the boat 31. Therefore, it is possible to efficiently supply the cooling air 90 to the exhaust side of the process tube 11 (the portion where the wafer 1 is not mounted) and to cool the exhaust side of the process tube 11 just like the process tube 11 corresponding to the substrate processing region of the boat 31. As a result, it is possible to uniformly cool the entire process tube 11.

In each zone, there is provided a check damper 104 as a reverse diffusion prevention part. The cooling air 90 is supplied to the buffer parts 106 via the gas introduction path 107 by opening and closing a reverse diffusion prevention body 104a. Then, the cooling air 90 supplied to the buffer parts 106 flows through a gas supply flow path 108 (not shown in FIG. 2) provided in the side wall inner layer 44. The cooling air 90 is supplied to the internal space 75 from opening holes 110 as openings which are parts of a supply path including the gas supply flow path 108.

When the cooling air 90 is not supplied from a gas source (not shown), the reverse diffusion prevention body 104a serves as a lid so that the atmosphere in the internal space 75 does not flow backward. The opening pressure of the reverse diffusion preventing body 104a may be changed depending on the zone. A heat insulating cloth 111 as a blanket is provided between the outer peripheral surface of the side wall outer layer 45 and the inner peripheral surface of the case 41 so as to absorb the thermal expansion of a metal.

Then, the cooling air 90 supplied to the buffer parts 106 flows through the gas supply flow path 108 (not shown in FIG. 2) provided in the side wall inner layer 44 so that the cooling air 90 is supplied from the opening holes 110 to the internal space 75.

As shown in FIGS. 1 and 2, a ceiling wall part 80 as a ceiling portion is covered on the upper end side of the side wall part 43 of the heat insulating structure 42 so as to close the internal space 75. An exhaust port 81 as a part of an exhaust path for exhausting the atmosphere in the internal space 75 is annularly formed in the ceiling wall part 80. The lower end, which is an upstream side end of the exhaust port 81, communicates with the internal space 75. The downstream end of the exhaust port 81 is connected to the exhaust duct 82.

Next, the operation of the substrate processing apparatus 10 will be described.

As shown in FIG. 1, when a predetermined number of wafers 1 are charged to the boat 31, the boat 31 holding the group of wafers 1 is loaded into the process chamber 14 of the inner tube 13 (boat loading) as the seal cap 25 is raised by the boat elevator 26. The seal cap 25 having reached the upper limit is pressed against the manifold 16 and is, therefore, brought into a state in which the seal cap 25 seals the inside of the process tube 11. The boat 31 is retained in the process chamber 14 while being supported by the seal cap 25.

Subsequently, the interior of the process tube 11 is evacuated by the exhaust pipe 18. In addition, as a temperature controller 64 performs sequence control, the interior of the process tube 11 is heated to a target temperature by a side wall heating element 56. An error between the actual raised temperature inside the process tube 11 and the target temperature for sequence control of the temperature controller 64 is corrected by feedback control based on the measurement result of a thermocouple 65. Further, the boat 31 is rotated by the motor 29.

When the internal pressure and the temperature of the process tube 11 and the rotation of the boat 31 come into a constant stable state as a whole, a precursor gas is introduced into the process chamber 14 of the process tube 11 from the gas introduction pipe 22 by the gas supply device 23. The precursor gas introduced by the gas introduction pipe 22 flows through the process chamber 14 of the inner tube 13 and passes through the exhaust path 17. The precursor gas is exhausted by the exhaust pipe 18. When the precursor gas flows through the process chamber 14, a predetermined film is formed on the wafer 1 by a thermal CVD reaction caused by the contact of the precursor gas with the wafer 1 heated to a predetermined processing temperature.

When a predetermined processing time elapses, the introduction of the processing gas is stopped. Thereafter, a purge gas such as a nitrogen gas or the like is introduced into the process tube 11 from the gas introduction pipe 22. At the same time, the cooling air 90 as a cooling gas is supplied from an intake pipe 101 to the gas introduction path 107 via the reverse diffusion prevention body 104a. The supplied cooling air 90 is temporarily stored in the buffer parts 106 and is blown out from the opening holes 110 to the internal space 75 via the gas supply flow path 108. The cooling air 90 blown out from the opening holes 110 into the inner space 75 is exhausted by the exhaust port 81 and the exhaust duct 82.

Since the entire heater unit 40 is forcibly cooled by the flow of the cooling air 90, the heat insulating structure 42 is quickly cooled together with the process tube 11. Inasmuch as the internal space 75 is isolated from the process chamber 14, the cooling air 90 can be used as a cooling gas. However, an inert gas such as nitrogen gas or the like may be used as a cooling gas in order to further enhance the cooling effect and to prevent corrosion of the side wall heating element 56 under a high temperature due to impurities present in the air.

When the temperature of the process chamber 14 drops to a predetermined temperature, the boat 31 supported by the seal cap 25 is lowered by the boat elevator 26 and is unloaded from the process chamber 14 (boat unloading).

Thereafter, as the above actions are repeated, the film-forming process on the wafer 1 is performed by the substrate processing apparatus 10.

Figure 12:
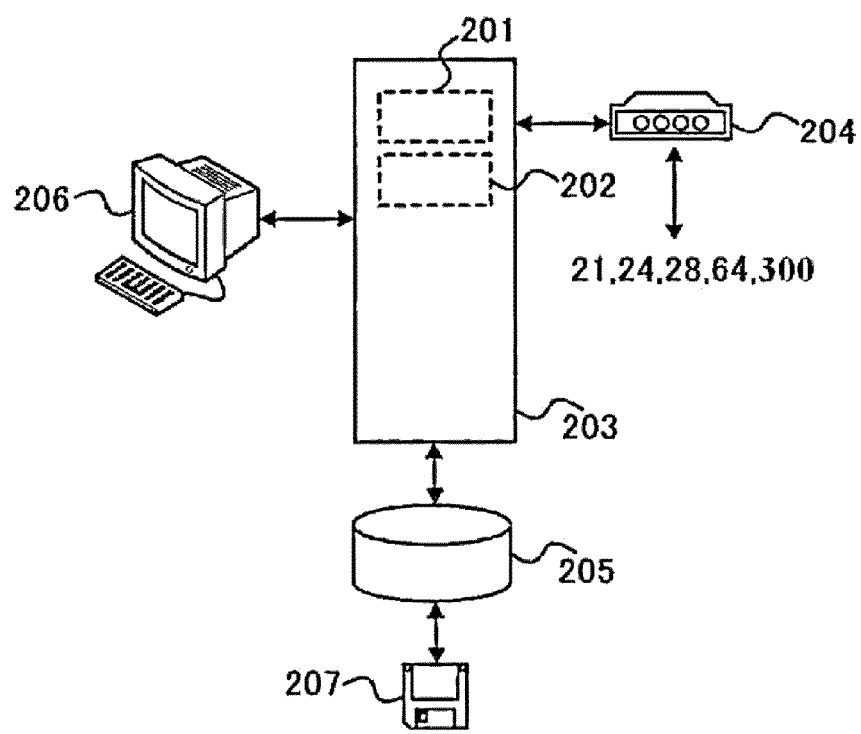
FIG. 12 is a view showing a hardware configuration of a control computer in the substrate processing apparatus according to one embodiment of the present disclosure.

As shown in FIG. 12, the control computer 200 serving as a controller includes a computer main body 203 including a CPU (Central Processing Unit) 201, a memory 202 and the like, a communication IF (Interface) 204 as a communication part, a memory device 205 as a memory part, and a display/input device 206 as an operation part. That is, the control computer 200 includes components of a typical computer.

The CPU 201 constitutes the center of the operation part, executes a control program stored in the memory device 205, and executes a recipe (e.g., a process recipe) recorded in the memory device 205 in response to an instruction from the operation part 206. Incidentally, it goes without saying that the process recipe includes the temperature control from step S1 to step S6 shown in FIG. 3 and described later.

In addition, a ROM (Read Only Memory), an EEPROM (Electrically Erasable Programmable Read Only Memory), a flash memory, a hard disk or the like is used as a recording medium 207 that stores the operation program of the CPU 201 and the like. A RAM (Random Access Memory) functions as a work area of the CPU or the like.

The communication IF 204 is electrically connected to the pressure controller 21, the gas flow rate controller 24, the drive controller 28 and the temperature controller 64 (which may be collectively referred to as sub-controllers). The communication IF 204 can exchange data on the operation of the respective components. In addition, the communication IF 204 is also electrically connected to a valve control unit 300 to be described later, so that the communication IF 204 can exchange data for controlling a multi-cooling unit.

In the embodiment of the present disclosure, the control computer 200 has been described as an example. However, the present disclosure is not limited thereto. but may be realized using an ordinary computer system. For example, the above-described processing may be executed by installing a program in a general-purpose computer from a recording medium 207 such as a CD-ROM or a USB storing a program for executing the above-described processing. Furthermore, a communication IF 204 including a communication line, a communication network, a communication system and the like may be used. In this case, for example, the program may be posted on a bulletin board of a communication network and may be provided via a network by superimposing the program on a carrier wave. By starting the program thus provided and executing the program just like other application programs under the control of an OS (Operating System), it is possible to perform the above-described processing.

Figure 3:
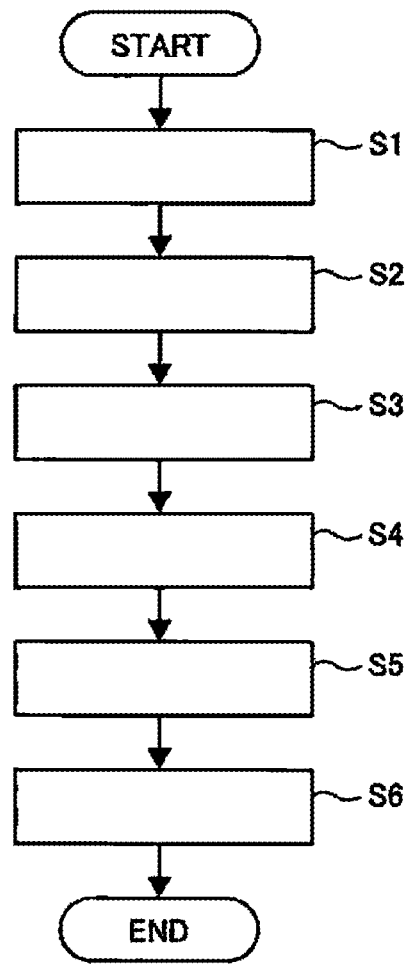
FIG. 3 is a flowchart showing an example of a temperature-related process in a film-forming process according to an embodiment of the present disclosure.
Figure 4:
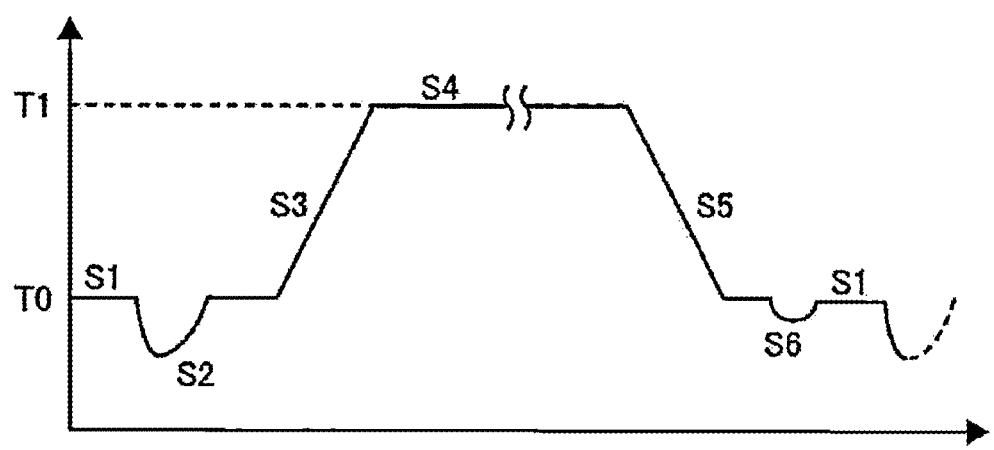
FIG. 4 is a view showing a temperature change in a furnace in the flowchart shown in FIG. 3.

Next, an example of the film-forming process performed by the substrate processing apparatus 10 will be described with reference to FIGS. 3 and 4. Symbols S1 to S6 shown in FIG. 4 indicate that steps S1 to S6 of FIG. 3 are performed.

Step S1 is a process in which the temperature inside the furnace is stabilized at a relatively low temperature T0. In step S1, the substrates 1 are not yet inserted into the furnace.

Step S2 is a process in which the substrates 1 held in the boat 31 are inserted into the furnace. Since the temperature of the substrates 1 is lower than the temperature T0 inside the furnace at this time, the temperature inside the furnace temporarily becomes lower than T0 as a result of inserting the substrates 1 into the furnace. However, by the temperature control device 74 to be described later, the temperature inside the furnace is stabilized at the temperature T0 again after a certain period of time. For example, when the temperature T0 is a room temperature, this step may be omitted. This step is not an essential step.

Step S3 is a process in which the temperature inside the furnace is raised by the heater unit 40 from the temperature T0 to a target temperature T1 for performing a film-forming process on the substrates 1.

Step S4 is a process in which the temperature inside the furnace is maintained and stabilized at the target temperature T1 in order to perform a film-forming process on the substrates 1.

Step S5 is a process in which, after the film-forming process is completed, the temperature inside the furnace is gradually lowered from the temperature T1 to a relatively low temperature T0 again by the cooling unit 280 and the heater unit 40 which will be described later. Furthermore, while turning off the heater unit 40, the temperature inside the furnace may also be rapidly lowered from the processing temperature T1 to the temperature T0 by the cooling unit 280.

Step S6 is a process in which the substrates 1 subjected to the film-forming process are taken out from the inside of the furnace together with the boat 31.

When unprocessed substrates 1 to be subjected to a film-forming process are left, the processed substrates 1 on the boat 31 are replaced with the unprocessed substrates 1, and the series of processes of steps S1 to S6 are repeated.

In each of the processes of steps S1 to S6, after obtaining a stable state in which the temperature inside the furnace is kept in a predetermined minute temperature range with respect to the target temperature and this state is continued for a predetermined time, the process flow proceeds to the next step. Alternatively, in recent years, in order to increase the number of substrates 1 subjected to a film-forming process within a certain period of time, the process flow proceeds to the next step without obtaining the stable state in steps S1, S2, S5 and S6.

Figure 5:
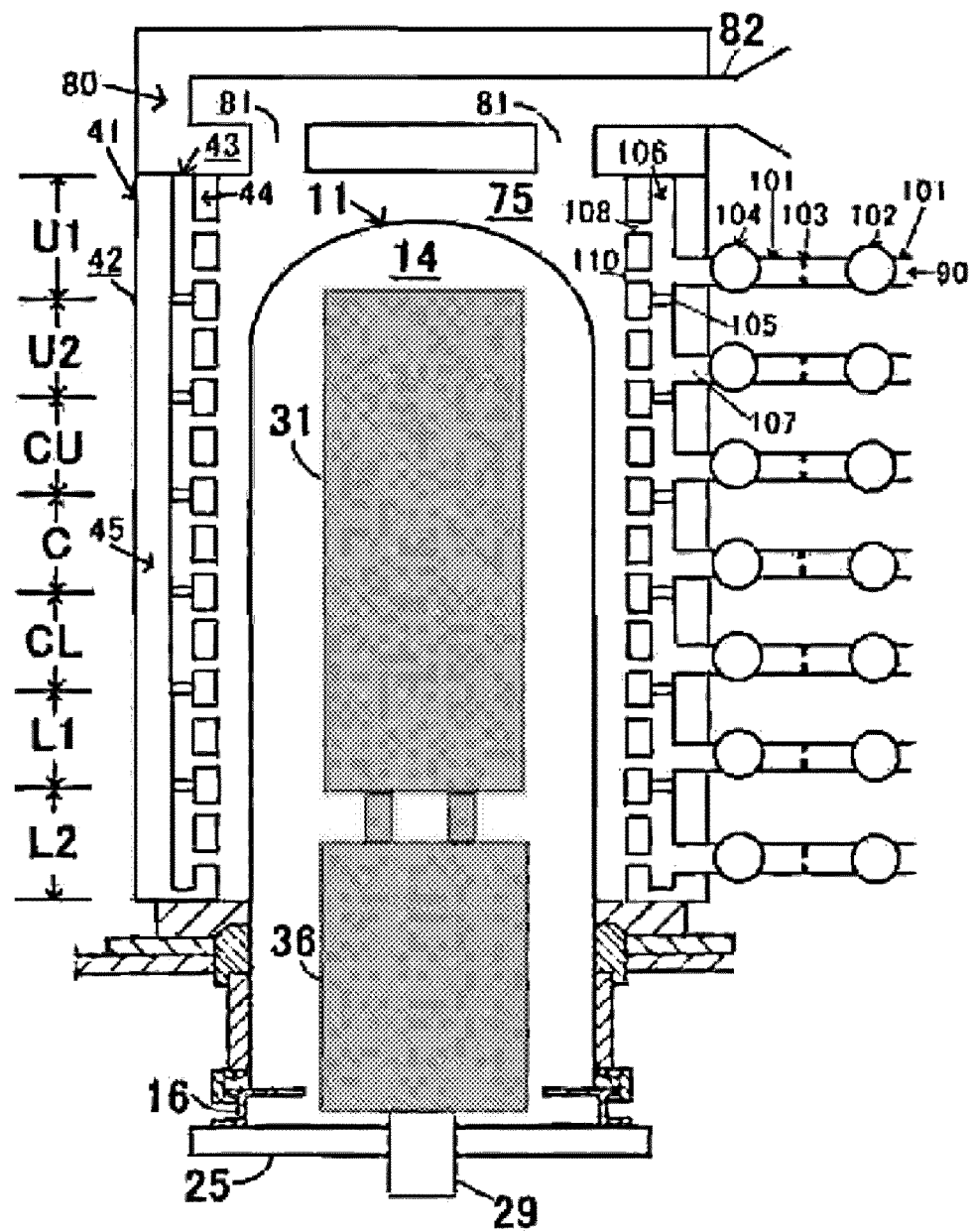
FIG. 5 is a view showing main components of the substrate processing apparatus according to one embodiment of the present disclosure.

FIG. 5 is an illustrative example for explaining a cooling unit (cooling device) 100 as a multi-cooling unit according to the present embodiment. The outer tube 12 and the inner tube 13 are omitted and are shown as one configuration with the process tube 11. The configuration relating to the heating device 40 is omitted.

As shown in FIG. 5, the cooling device 100 includes a heat insulating structure 42 having a plurality of cooling zones in the vertical direction, an intake pipe 101 configured to supply a cooling air 90 as a cooling gas for cooling the inside of the process tube 11 to each of the cooling zones, a control valve 102 as a conductance valve provided in the intake pipe 101 and configured to adjust the flow rate of the gas, and a check damper 104 provided in the intake pipe 101 and configured to prevent reverse diffusion of an atmosphere from the heat insulating structure 42. In addition, the ceiling wall part 80 including the exhaust port 81 and the exhaust duct 82 for exhausting an atmosphere from the space 75 may be regarded as the component of the cooling device 100.

The cooling device 100 includes at least an intake pipe 101 configured to supply a cooling air 90 for cooling the process tube 11 to each of a plurality of cooling zones, a control valve 102 provided in the intake pipe 101, a buffer part 106 communicating with the intake pipe 101 installed in each of the cooling zones and configured to temporarily store the gas supplied from the intake pipe 101, and a plurality of opening holes 110 configured to inject the cooling air 90 stored in the buffer part 106 toward the process tube 11 via a gas supply flow path 108 provided in the side wall inner layer 44. The cooling device 100 is configured to uniformly maintain the flow rate and the flow velocity of the cooling air 90 injected from each opening hole 110 in each cooling zone.

The cross-sectional area (or the pipe diameter) of the intake pipe 101 in each of the cooling zones is determined according to the ratio of the lengths in the height direction of the respective cooling zones. As a result, the amount of injected air is made uniform between the respective cooling zones. In addition, the cross-sectional area of the intake pipe 101 is set larger than the total cross-sectional area of the opening holes 110. Similarly, the flow path cross-sectional area of the buffer part 106 is set larger than the total cross-sectional area of the opening holes 110. In FIG. 5, the lengths of the cooling zones in the height direction are substantially the same. Therefore, the intake pipe 101, the control valve 102 and the check damper 104 having the same size are provided for each of the cooling zones.

Further, the opening holes 110 are provided at the same intervals in the circumferential direction and the vertical direction within each of the cooling zones. Therefore, the cooling device 100 can uniformly blow the cooling air 90 stored in the buffer part 106 to the space 75 via the gas supply flow path 108. In addition, by adjusting the flow rate of the cooling air 90 introduced into the intake pipe 101 according to the ratio of the lengths in the height direction of the respective cooling zones and by opening and closing the control valve 102, it is possible to make uniform the flow rate and the flow velocity of the gas injected from the opening holes 110 to the process tube 11.

The process tube 11 facing the respective cooling zones from the substantially same height as the uppermost stage of a region where the product substrates mounted on the boat 31 are located to the lowermost stage of a region where the product substrates are located is uniformly cooled by the cooling air 90. That is, the cooling device 100 can uniformly cool the cooling zones and the gaps between the cooling zones.

Since the atmosphere in the space 75 is exhausted from the upper exhaust port 81, the check damper 104 is configured to communicate with the center of the buffer part 106 provided in each of the cooling zones so that the cooling air 90 can be efficiently stored in the buffer part 106. The check damper 104 may be configured to communicate with the lower side of the buffer part 106.

The intake pipe 101 is also provided with a throttle part 103 as an orifice for suppressing the flow rate of the cooling air 90 injected from the opening holes 110. However, the throttle part 103 may be provided for each of the cooling zones as necessary.

For example, when the lengths in the height direction of the respective cooling zones are different and the flow rates of the cooling air 90 introduced into the respective cooling zones are different, the cooling air 90 introduced into the respective cooling zones is the same. However, the throttle part 103 is provided to suppress the cooling capacity of a predetermined cooling zone and is provided to adjust the flow rate and the flow velocity of the cooling air 90.

In addition, the valve control unit 300 is configured to adjust the opening degree of the control valve 102 based on the setting value from the controller 200 and based on the data from the temperature controller 64 and the thermocouple 65. As a result, the cooling capacity of each of the cooling zones can be adjusted by the opening degree of the control valve 102. It is therefore possible to reduce the difference between the apparatuses caused by the fluctuation of a customer's facility exhaust capability at the time of rapid cooling, the variation of individual parts, and the installation condition in the apparatus.

The heat insulating structure 42 used for the heating device 40 having a plurality of control zones (U1, U2, CU, C, CL, L1 and L2 in the present embodiment) as heating regions includes: a side wall part 43 formed in a cylindrical shape and having a multilayer structure; partition parts 105 configured to partition the side wall part 43 into a plurality of cooling zones (U1, U2, CU, C, CL, L1 and L2) in a vertical direction; buffer parts 106 as annular buffers constituted by cylindrical spaces between a side wall inner layer 44 and a side wall outer layer 45 and spaces between the partition parts 105 adjacent to each other in the vertical direction; gas introduction paths 107 provided in a side wall outer layer 45 disposed on the outer side among a plurality of layers of the side wall part 43 for each cooling zone and communicating with the buffer parts 106; gas supply flow paths 108 provided in a side wall inner layer 44 disposed on the inner side among the plurality of layers of the side wall part 43 for each cooling zone and communicating with the buffer parts 106; a space 75 provided inside the side wall inner layer 44; and opening holes 110 provided at equal intervals in a circumferential direction and a vertical direction of the side wall inner layer 44 so as to blow a cooling air 90 from the gas supply flow paths 108 to the space 75 for each cooling zone.

Figure 6:
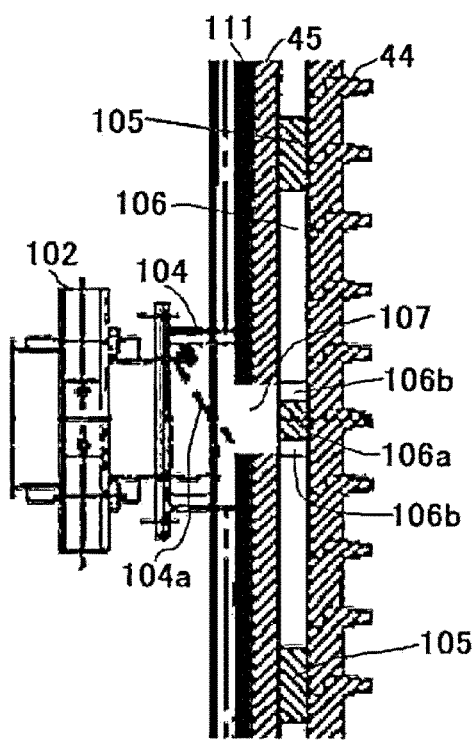
FIG. 6 is an enlarged view of some of the main components shown in FIG. 5.

FIG. 6 is an enlarged view of a connection state between the heat insulating structure 42 shown in FIG. 5 and the check damper 104. FIG. 6 is an enlarged view of the CL zone shown in FIG. 5. The gas supply flow paths 108 and the opening holes 110 provided in the side wall inner layer 44 are omitted.

The partition parts 105 are provided between the side wall outer layer 45 and the side wall inner layer 44, and each of the buffer parts 106 is provided in the space between the partition parts 105. The buffer part 106 is configured to be divided into an upper region and a lower region by the partition part 106a. Since there is provided the partition part 106a, it is possible to suppress the occurrence of convection which may occur in the buffer part 106. Convection occurs in the heat insulating structure 42, i.e., in the buffer part 106 due to the temperature difference between the side wall heating element 56 and the water cooling jacket (not shown). Especially, when a rapid cooling function is not used, the temperature difference is about 1 degrees C. above and below the cooling zone. The partition part 106b as a third partition part shown in FIG. 6 divides an intake part 113 as an introduction port for allowing the gas introduction path 107 and the buffer part 106 to communicate with each other into two portions. Details of the partition part 106b and the intake part 113 will be described later.

The check damper 104 is provided via the gas introduction path 107. The material of the check damper 104 and the reverse diffusion prevention body 104a is stainless steel. Since the check damper 104 is connected to a heat insulating material used for the heater unit 40, the check damper 104 is configured by taking thermal resistance into consideration. Between the case 41 and the side wall outer layer 45, there is provided a heat insulating cloth 111 for absorbing thermal expansion.

As shown in FIG. 6, while keeping the reverse diffusion prevention body 104a opened, the cooling air 90 is once stored in the buffer part 106 and is supplied to the space 75 via the gas supply flow path 108 (not shown). On the other hand, when the cooling air 90 is not used, the reverse diffusion prevention body 104a is closed to prevent convection between the intake pipe 101 and the heat insulating structure 42 (not shown).

Furthermore, the opening holes 110 are provided so as to avoid the position facing the gas introduction path 107. The cooling air 90 supplied from the gas introduction path 107 is not directly introduced from the opening holes 110 into the space via the buffer part 106. The cooling air 90 supplied from the gas introduction path 107 is temporarily stored in the buffer part 106.

As a result, the cooling air 90 introduced into the gas introduction path 107 is temporarily stored in the buffer part 106, and the gas supply pressures relating to the respective opening holes 110 are equal to each other. Therefore, the cooling air 90 having the same flow rate and the same flow velocity is blown out from the respective opening holes 110 provided in the buffer part 106.

Furthermore, the cross-sectional areas of the two intake parts 113 and the cross-sectional area of the buffer part 106 in each zone are set larger than the sum of the cross-sectional areas of the opening holes 110. As a result, the cooling air 90 introduced by opening the reverse diffusion prevention body 104a is supplied via the intake part 113 and is, therefore, easily stored in the buffer part 106. Thus, the cooling air 90 is supplied from the opening holes 110 at the same flow rate and the same flow velocity.

Figure 7:
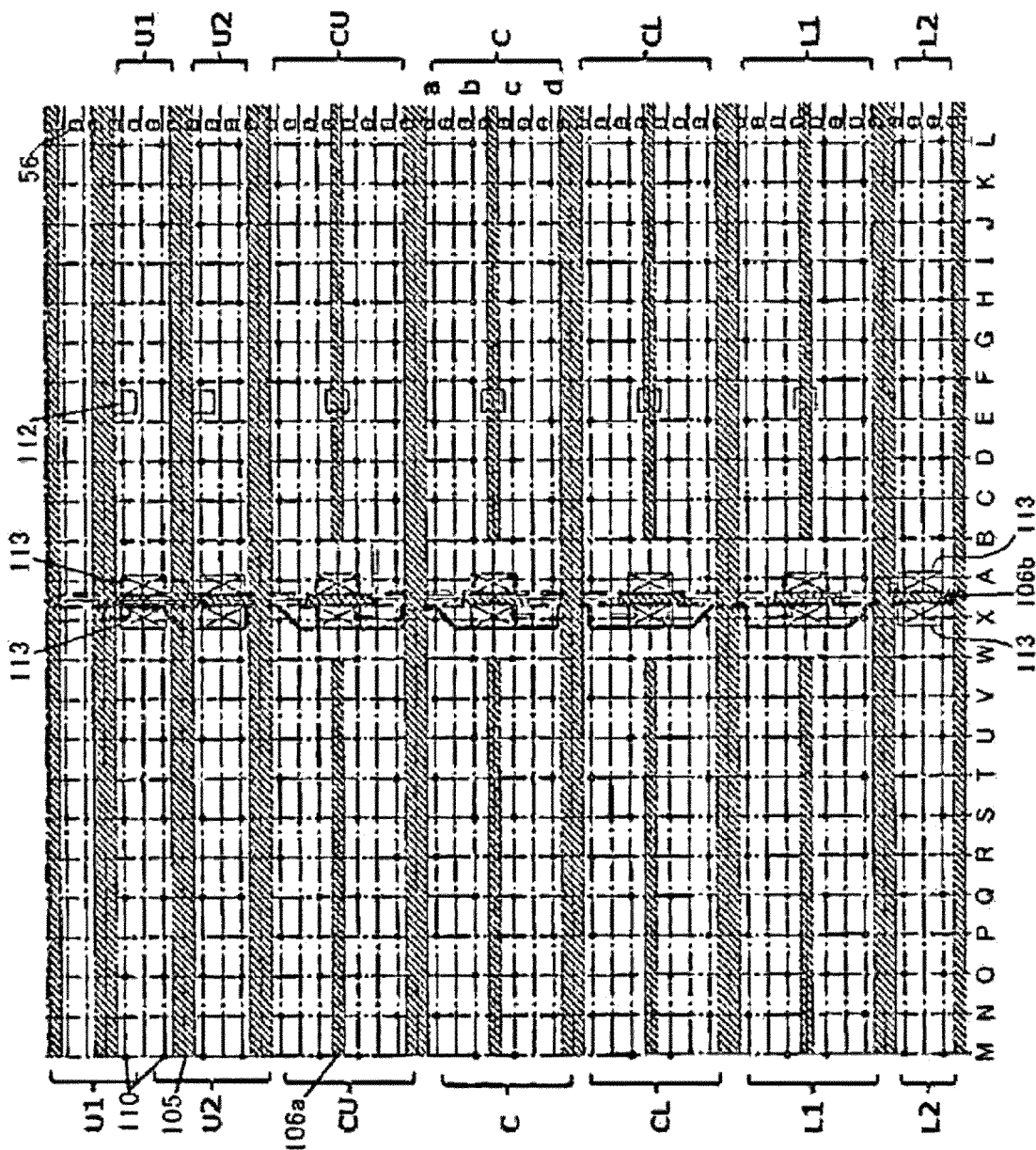
FIG. 7 is a developed view of a heat insulating structure in the substrate processing apparatus according to one embodiment of the present disclosure.

FIG. 7 is a developed view of the side wall inner layer 44. As shown in FIG. 7, the side wall inner layer 44 is divided into a plurality of cooling zones (U1, U2, CU, C, CL, L1 and L2) by the partition parts 105. The opening holes 110 are disposed at appropriate positions in the vertical direction (in the height direction) and the horizontal direction (circumferential direction). In each zone, the opening holes 110 are arranged at multiple stages in the vertical direction and are arranged in a plural number in the horizontal direction. Specifically, the number of rows of the opening holes 110 provided in the buffer part 106 is determined depending on the vertical length of each zone. The opening holes 110 are provided substantially evenly in the circumferential direction in each row. Each zone includes a plurality of areas (A, B, C, W, X) disposed in the circumferential direction. The opening holes 110 are arranged in a zigzag in the height direction within each area of a certain one zone. The opening holes 110 are substantially evenly arranged at equal intervals in the vertical direction and the horizontal direction within all zones.

Twelve opening holes 110 are arranged in the circumferential direction of each cooling zone (U1, U2, CU, C, CL, L1 or L2). Two rows of opening holes 110 are provided in each of the U1 zone, the U2 zone and the L2 zone in the height direction, and four rows of opening holes 110 are provided in each of the CU zone, the C zone, the CL zone and the L1 zone in the height direction. Therefore, 24 opening holes 110 are provided in each of the U1 zone, the U2 zone and the L2 zone, and 48 opening holes 110 are provided in each of the CU zone, the C zone, the CL zone and the L1 zone. Thus, the flow rate ratio of the air introduced into the intake pipes 101 and supplied to the U1 zone (U2 or L2 zone), the C zone and the remaining zones is determined into U1 zone (U2 or L2 zone): C zone (CU, CL or L1 zone)=1:2=24 opening holes 110: 48 opening holes 110.

In addition, the opening holes 110 are provided so as to avoid the position where the intake part 113 provided at the boundary between the gas introduction path 107 and the buffer part 106 is provided. In other words, the opening holes 110 may be provided at any position not facing the intake part 113. In addition, the opening holes 110 are disposed so that the cooling air 90 blown out from the opening holes 110 is blown out while avoiding the side wall heating element 56. The thermocouple 65 is covered with a wind blocking block 112 so as to prevent the cooling air 90 blown out from the opening holes 110 from directly hitting the thermocouple 65 and so as not to be affected by the cooling air 90. In FIG. 7, the opening holes 110 are different in size. However, FIG. 7 is nothing more than a schematic diagram. The opening cross-sectional areas of the respective opening holes 110 are set to have substantially the same size.

The control zones (U1, U2, CU, C, CL, L1 and L2 in the present embodiment) shown on the left side in FIG. 7 and the cooling zones (U1, U2, CU, C, CL, L1 and L2) shown on the right side in FIG. 7 are the same number and have the same flow path cross-sectional area up to the CU zone, the C zone, the CL zone, the L1 zone, the L2 zone. In other words, the CU zone, the C zone, the CL zone, the L1 zone and L2 zone are coincident with the regions surrounded by the upper and lower partition parts 105. However, the flow path cross-sectional areas of the U1 zone and the U2 zone are larger in the control zones than in the cooling zones. As a result, the upper cooling zones (U1 and U2 zones) among the plurality of cooling zones are shorter in vertical length than the upper control zones (U1 and U2 zones) among the plurality of control zones. In other words, the cooling zones (U1 zone and U2 zone) coinciding with the regions surrounded by the upper and lower partition parts 105 are shifted downward from the control zones (U1 zone and U2 zone). Details of the arrangement positions of the upper region (U1 zone and U2 zone) of the control zones and the upper region (U1 zone and U2 zone) of the cooling zones will be described later. In addition, the U1 zone and the U2 zone of the cooling zones have the same flow path cross-sectional area as the L2 zone.

As shown in FIG. 7, the flow path cross-sectional area of the U1 zone, the U2 zone and the L2 zone is small, and the flow path cross-sectional area of the cooling zones (for example, the C zone) other than the U1 zone, the U2 zone and the L2 zone is large. In the C zone, there is provided the partition part 106a for dividing the buffer part 106 into an upper region and a lower region. The upper and lower regions thus divided are configured to have the same flow path cross-sectional area as that of, for example, the U1 zone (U2 zone and L2 zone). Similar to the C zone, each of the CU zone, the CL zone and the L1 zone having a large flow path cross-sectional area is similarly divided into upper and lower regions by the partition part 106a. As described above, the regions provided in all the cooling zones have substantially the same flow path cross-sectional area due to the partition part 106a. Therefore, by supplying the cooling air 90 to the intake pipe 101 in proportion to the length in the height direction of the cooling zones, it is possible to supply the cooling air 90 passed through the gas introduction path 107 from the intake part 113 to each buffer part 106.

Further, as shown in FIG. 7, the intake part 113, which is the introduction port of the cooling air 90 to the heat insulating structure 42, has a rectangular shape. The intake part 113 is divided into two regions by the partition part 106b, and the height of the two regions divided by the partition part 106b is 114 mm. Further, this height is substantially the same as the height of the buffer part 106 of the U1 zone, the U2 zone and the L2 zone. Therefore, by supplying the cooling air 90 to the intake pipe 101 in the U1 zone, the U2 zone and the L2 zone, the direction of the gas supplied from the intake pipe 101 to the buffer part 106 is uniformly determined by the partition part 106b provided in the buffer part 106. Therefore, it is possible to supply the cooling air 90 introduced from the intake part 113 into each buffer part 106.

In order to divide the intake section 113 into two portions, the partition part 106b is provided in each cooling zone. Particularly, in the U1 zone, the U2 zone and the L2 zone, the flow direction of the cooling air 90 is determined in the circumferential direction by the partition part 106b. As a result, by the partition part 106b provided in the buffer part 106, the gas passing through the gas introduction path 107 can be distributed efficiently in the circumferential direction inside the buffer part 106. In order to enhance this effect, the intake pipe 101 may be connected by inclining it with respect to the intake part 113.

In this way, the opening holes 110 are arranged according to each cooling zone and the partition part 106a and/or the partition part 106b is provided in the buffer part 106. Therefore, by supplying the cooling air 90 to the intake pipe 101 in proportion to the length in the height direction of the cooling zone, it is possible to supply the cooling air 90 having the same flow rate and the same flow velocity from the opening holes 110 toward the process tube 11 in each cooling zone. Furthermore, in between the respective cooling zones, it is possible to make adjustment so as to supply the cooling air 90 having the same flow rate and flow velocity from the opening holes 110. Thus, it is possible to efficiently cool the process tube 11 provided at the position facing the respective cooling zones. For example, the temperature deviation within the zones and between the zones can be reduced at the time of rapid cooling (for example, at the temperature lowering step S5 described above).

Therefore, when the cooling air 90 having the determined flow rate is introduced into the intake pipe 101 of each cooling zone, the reverse diffusion prevention body 104a is opened so that the introduced cooling air 90 is stored in the buffer part 106 via the intake part 113. In particular, according to the present embodiment, by appropriately providing the partition parts 106a and 106b in the buffer part 106 according to the cooling zone and efficiently distributing the cooling air 90 into the buffer part 106, it is possible to make uniform the supply pressures relating to the respective opening holes 110. Therefore, the cooling air 90 having the same flow rate and the same flow velocity in all the zones and between all the zones can be supplied from the opening holes 110 via the gas supply flow path 108. This makes it possible to evenly cool the process tube 11. The flow rate of the cooling air 90 may be a flow rate falling within a range that can be adjusted by the control valve 102 in some embodiments. This makes it possible to finely control the flow rate of the cooling air 90 introduced into each zone.

Therefore, in the present embodiment, the cooling air 90 having the same flow rate and flow velocity in all the zones and between all the zones can be supplied from the opening holes 110 via the gas supply flow path 108. Therefore, it is possible to evenly cool the process tube 11. The flow rate of the cooling air 90 may be a flow rate falling within a range that can be adjusted by the control valve 102 in some embodiments. This makes it possible to finely control the flow rate of the cooling air 90 introduced into each zone.

It goes without saying that the opening holes 110 are provided so as to avoid the position facing the gas introduction path 107 and are arranged so that the cooling air 90 blown out from the opening holes 110 can avoid the side wall heating element 56.

Further, in the present embodiment, the partition part 105 is arranged so that the number of control zones and the number of cooling zones coincide with each other. Thus, it is possible to perform continuous control of heating and cooling by making the number of control zones equal to the number of cooling zones. In particular, by devising the arrangement positions of the cooling zones U1 and U2 relative to the control zones U1 and U2, it is possible to shorten the temperature recovery time at the time of temperature rise and fall. However, the present disclosure is not limited to this embodiment. The number of control zones and the number of cooling zones may be arbitrarily set.

In the present embodiment, the height of the cooling zones U1 and U2 facing the control zones U1 and U2 is set to be smaller than the respective zone heights. This makes it possible to efficiently supply the cooling air 90 to each control zone. As a result, the cooling air 90 supplied to the control zones U1 and U2 can be made equal to the cooling air 90 supplied to other control zones. Temperature control equivalent to that of the control zones CU, C, CL, L1 and L2 can also be performed even in the control zones U1 and U2.

As described above, in the present embodiment, by shifting downward the cooling zones U1 and U2 opposed to the control zones U1 and U2 which are close to the exhaust side and which are difficult to be efficiently supplied with the cooling air 90, it is possible to maintain the same temperature control characteristics as in the internal space 75 (not shown) opposed to the control zones U1 and U2 and the internal space 75 (not shown) opposed to other control zones. It is also possible to improve responsiveness of heating and cooling control between the zones.

EXAMPLE

Next, an example in which the cooling unit 100 according to the present embodiment is verified will be described with reference to FIGS. 8 to 12.

Figure 8:
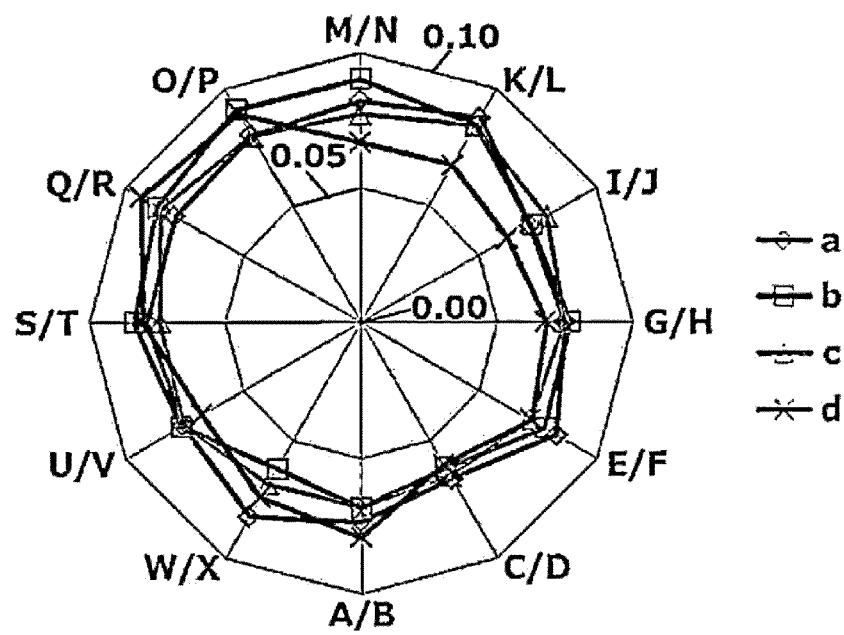
FIG. 8 is a view showing a flow velocity of a cooling unit in the substrate processing apparatus according to one embodiment of the present disclosure.

FIG. 8 shows a table comparing the injected wind velocities (flow velocities) of the cooling air 90 injected from the respective opening holes 110 in the C zone shown in FIG. 7. The temperature is a room temperature. The table is the result of measuring the flow velocity in the opening holes 110 when the cooling air 90 is supplied to the intake pipe 101 of the C zone at a flow rate of 2.0 m$^3$/min. As described above, according to the present embodiment, it is possible to make substantially uniform the injection velocities of the cooling air 90 injected from the respective opening holes 110. As shown in FIG. 7, a indicates an uppermost region of the C zone, b indicates a second region from the top of the C zone, c indicates a third region from the top of the C zone, and d indicates a fourth (lowermost) region from the top of the C zone.

Figure 9:
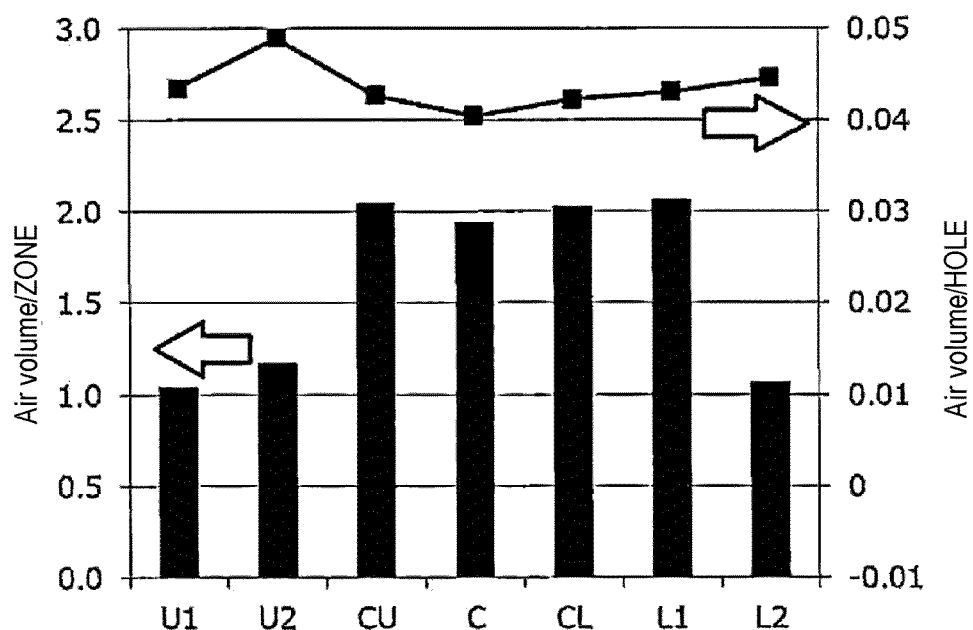
FIG. 9 is a view showing flow rates in zones of a cooling unit in the substrate processing apparatus according to one embodiment of the present disclosure.

FIG. 9 shows the result of measuring the air volume in the gas introduction path 107 of the cooling unit according to the present embodiment. The air volume of each zone is proportional to the zone height. At this time, the air volume (average air volume) per one opening hole 110 is 0.04 to 0.05 m$^3$/min. It is possible to make substantially uniform the injection velocities of the cooling air 90 injected from the respective opening holes 110 in all the zones.

Figure 10:
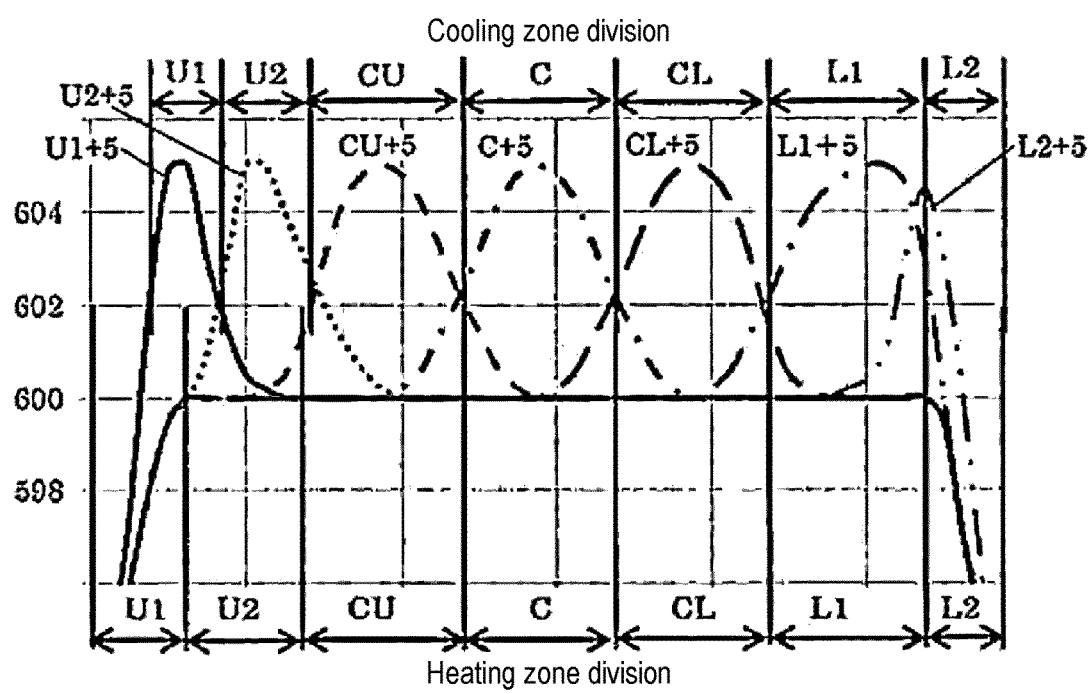
FIG. 10 is a view showing a cooling zone division and a heating influence range in the substrate processing apparatus according to one embodiment of the present disclosure.

FIG. 10 shows the result of checking the heating influence (temperature interference matrix data). More specifically, the set temperature (600 degrees C. in the Example) is increased by about 5 degrees C. for each zone, and the results of checking the temperature influence range at that time are overlappingly indicated. For example, the waveform in the U1 zone is denoted by U1+5 in FIG. 10. As shown in FIG. 10, the heating influence ranges of the U1 zone and the U2 zone are shifted downward from the respective heating zone dividing positions. In the present embodiment, the cooling zones U1 and U2 are arranged in conformity with the shift of the heating influence ranges of the U1 zone and the U2 zone. Therefore, it is possible to supply the cooling air 90 to the process tube 11 facing the heating zones of the U1 zone and the U2 zone.

Further, the exhaust system of the cooling device 100 is installed on the upper side. Therefore, particularly in the U1 zone and the U2 zone, the cooling influence range by the cooling device 100 tends to be shifted upward from the heating zone dividing position. Thus, the cooling zones U1 and U2 are arranged at the positions shifted downward from the heating zones U1 and U2. For example, in the plurality of cooling zones shown in FIG. 7, the cooling zone division is performed in consideration of the shift of the heating influence range and the cooling influence range described above, thereby improving the cooling effect by the cooling air 90.

Further, as shown in FIG. 2, the cooling zones of the cooling device 100 are configured so that the opening holes 110 are provided at the position facing the region (the substrate processing region of the boat 31) in which various substrates including product substrates are present, and the opening holes 110 are provided at the position facing the upper side of the process tube 11 (the upper side of the substrate processing region of the boat 31). Thus, it is possible to make uniform the flow rate and the flow velocity of the cooling air 90 supplied to the entire process tube 11. As a result, it is possible to reduce the temperature deviation in the zones and between the zones.

Figure 11:
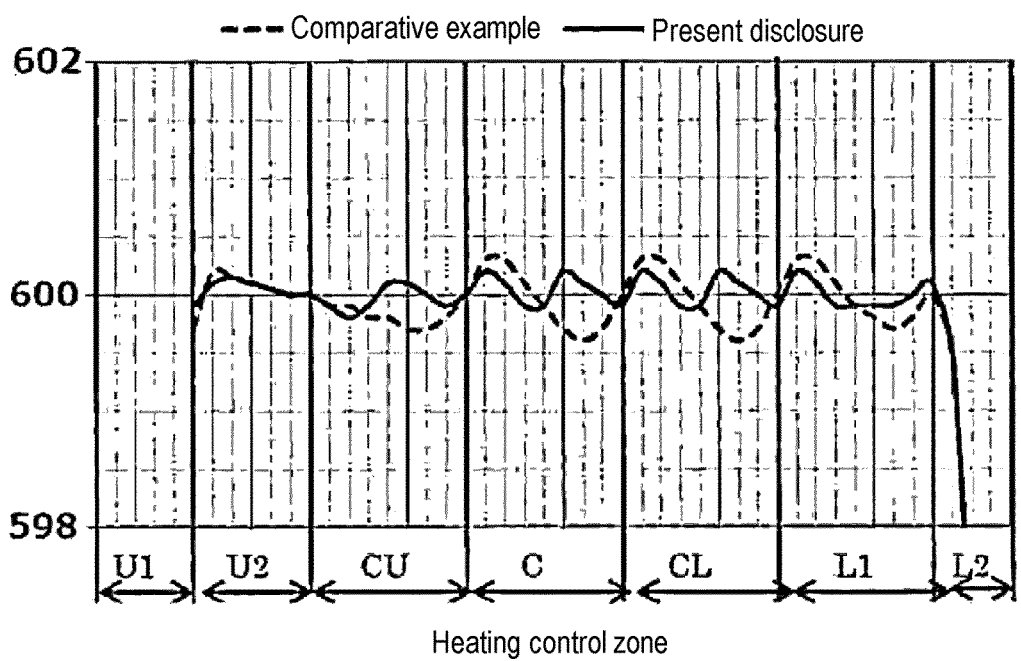
FIG. 11 is a view showing a soaking length distribution in the substrate processing apparatus according to one embodiment of the present disclosure.

FIG. 11 compares the temperature distributions in the respective zones when the temperature is stabilized at 600 degrees C. in the case of not using the cooling unit 100.

Thus, according to the cooling unit 100 of the present embodiment, it is possible to improve the inter-wafer temperature uniformity.

According to the present embodiment described above, the following effects may be achieved.

(a) According to the present embodiment, the cooling unit includes: an intake pipe provided for each of a plurality of zones and configured to supply a gas for cooling a reaction tube; a control valve provided in the intake pipe and configured to adjust a flow rate of the gas; a buffer part configured to temporarily store the gas supplied from the intake pipe; and an opening provided so as to blow the gas stored in the buffer part toward the reaction tube, wherein the flow rate of the gas introduced into the intake pipe is set according to vertical length ratios of the zones so that the flow rate and the flow velocity of the gas injected from the opening toward the reaction tube are adjusted by opening and closing the control valve. Therefore, it is possible to uniformly cool the reaction tube.

(b) According to the present embodiment, a reverse diffusion prevention part for preventing reverse diffusion of an atmosphere from the inside of a furnace is provided in the intake pipe. Therefore, reverse diffusion is prevented in case of not using a cooling gas. This makes it possible to suppress influence of heat of the heating device 40.

(c) According to the present embodiment, a flow path cross-sectional area of the intake pipe provided for each cooling zone and a flow path cross-sectional area of the buffer part provided for each cooling zone are set to be larger than the sum of cross-sectional areas of opening holes provided for each cooling zone. Therefore, by adjusting the flow rate of the cooling gas supplied to the intake pipe provided in each cooling zone, the flow rate and the flow velocity of the cooling gas injected from each of the opening holes can be made uniform in the cooling zone. Moreover, by making the gas supply pressure substantially uniform in the respective opening holes, it is possible to make uniform the gas supply pressure not only in the cooling zones but also between the cooling zones. This makes it possible to evenly cool the reaction tube.

(d) According to the present embodiment, if a throttle part for throttling a flow rate is provided in the intake pipe, when it is necessary to reduce the flow rate due to the large diameter of the intake pipe, it is possible to throttle the flow rate of the cooling air supplied from the intake pipe.

(e) According to the present embodiment, the heat insulating structure includes: a side wall part formed in a cylindrical shape and having a multilayer structure; partition parts configured to partition the side wall part into a plurality of regions in a vertical direction; buffer parts provided between the partition parts adjacent to each other in the side wall part; gas introduction paths provided in a side wall outer layer disposed on an outer side among a plurality of layers of the side wall part and communicating with the buffer parts; gas supply flow paths provided in a side wall inner layer disposed on an inner side among the plurality of layers of the side wall part and communicating with the buffer parts; and openings provided so as to blow a cooling gas from the gas supply flow paths to a space inside the side wall inner layer. Therefore, by adjusting the flow rate of the cooling gas supplied to the intake pipe provided in each region, it is possible to make uniform the flow rate and the flow velocity of the cooling gas injected from the respective opening provided in the circumferential direction and the height direction in each region.

(f) According to the present embodiment, the height of the cooling zones U1 and U2 is shifted to the lower side than the heating zones U1 and U2. It is possible to uniformly supply the cooling gas not only to the reaction tube opposed to the substrate processing region of the boat 31 but also to the reaction tube of the upper region of the substrate processing region of the boat 31. This makes it possible to equally apply the cooling gas not only in the cooling zones but also between the cooling zones and to evenly cool the entire reaction tube. Thus, it is possible to improve the temperature controllability of the heating zones U1 and U2.

(g) According to the present embodiment, by shifting the height of the cooling zones U1 and U2 to the lower side than the heating zones U1 and U2, it is possible to make uniform the flow rate and the flow velocity of the cooling gas supplied to the entire process tube 11 and to evenly cool the entire reaction tube. Therefore, it is possible to improve the responsiveness of the heating and cooling control between the control zones.

(h) Further, according to the present embodiment, in order to make uniform the supply pressure relating to the respective opening holes in each cooling zone, the cooling gas is supplied from the opening holes at the same flow rate and the same flow velocity. The temperature control characteristics of each control zone are maintained. Therefore, it is possible to improve the responsiveness of the heating and cooling control between the zones. As a result, the temperature recovery time of the substrate and the in-plane temperature uniformity of the substrate are improved, and the rapid heating capability is improved. In addition, the temperature deviation at the time of rapid cooling can be made substantially uniform in each zone. Thus, the inter-substrate temperature uniformity is improved.

The present disclosure may be applied not only to a semiconductor manufacturing apparatus but also to an apparatus for processing a glass substrate such as an LCD device or the like.

In addition, the present disclosure relates to a semiconductor manufacturing technique and, particularly, to a heat treatment technique for processing a substrate accommodated in a processing chamber and heated by a heating device. For example, the present disclosure may be applied to a substrate processing apparatus used for performing oxidation processing, diffusion processing, reflowing or annealing for carrier activation and flattening after ion implantation, film formation processing by thermal CVD reaction, and the like on a semiconductor wafer incorporating a semiconductor integrated circuit device (semiconductor device).

According to the present disclosure in some embodiments, it is possible to improve a responsiveness of heating control and cooling control between zones.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A cooling unit, comprising:
an intake pipe provided for each of a plurality of zones and configured to supply a gas for cooling a reaction tube;

a control valve provided in the intake pipe and configured to adjust a flow rate of the gas;

a buffer configured to temporarily store the gas supplied from the intake pipe; and openings provided so as to blow the gas stored in the buffer toward the reaction tube, wherein the cooling unit is provided to cover a periphery of a heating device having a plurality of control zones in a vertical direction, wherein first partitions are arranged so that the number of the control zones and the number of the plurality of zones coincide with each other, and wherein the plurality of zones are formed between the first partitions arranged on upper and lower sides, and the first partition on the upper side is shifted downward so that height of the plurality of zones is lower than height of the control zones in an upper one of the plurality of zones facing an upper one of the control zones.

2. The cooling unit of claim 1, wherein a diffusion prevention damper configured to prevent reverse diffusion of an atmosphere from an inside of a furnace is provided in the intake pipe.

3. The cooling unit of claim 1, wherein an orifice configured to suppress a flow rate of a cooling gas injected from the openings is provided in the intake pipe.

4. The cooling unit of claim 1, wherein each of a flow path cross-sectional area of the intake pipe provided for each zone and a flow path cross-sectional area of the buffer provided for each zone is individually set to be larger than a sum of cross-sectional areas of the openings provided for each zone.

5. The cooling unit of claim 1, wherein the buffer is provided with second partitions for each zone, and wherein the second partitions are configured to determine a direction of the gas supplied from the intake pipe to the buffer.

6. A heat insulating structure, comprising:

a side wall part formed in a cylindrical shape and having a multilayer structure;

first partitions configured to partition the side wall part into a plurality of zones in a vertical direction;

buffers provided between the first partitions adjacent to each other in the side wall part;

gas introduction paths provided in an outer layer disposed on an outer side among a plurality of layers of the side wall part for each of the zones and communicating with the buffers;

gas supply flow paths provided in an inner layer disposed on an inner side among the plurality of layers of the side wall part for each of the zones and communicating with the buffers;

a space provided inside the inner layer; and openings provided so as to blow a cooling gas from the gas supply flow paths to the space for each of the zones, wherein the heat insulating structure is provided to cover a periphery of a heating device having a plurality of control zones in the vertical direction, wherein the first partitions are arranged so that the number of the plurality of control zones and the number of the plurality of zones coincide with each other, and wherein the plurality of zones are formed between the first partitions arranged on upper and lower sides, and the first partition on the upper side is shifted downward so that height of the plurality of zones is lower than height of the control zones in an upper one of the plurality of zones facing an upper one of the control zones.

7. The heat insulating structure of claim 6, wherein a flow path cross-sectional area of the buffer is set to be larger than a sum of flow path cross-sectional areas of the openings provided for each of the zones.

8. The heat insulating structure of claim 6, wherein the openings are provided so as to avoid positions opposed to introduction ports configured to bring the gas introduction paths and the buffers into communication with each other.

9. The heat insulating structure of claim 6, wherein the buffers are provided with second partitions provided for each of the zones, and the second partitions are configured to determine a direction of a gas flowing through the buffers.

10. A substrate processing apparatus, comprising:

an intake pipe provided for each of a plurality of zones and configured to supply a gas for cooling a reaction tube;

a control valve provided in the intake pipe and configured to adjust a flow rate of the gas;

openings provided in each of the zones and configured to inject the gas toward the reaction tube;

a buffer communicating with the intake pipe in each of the zones and configured to temporarily store the gas supplied from the intake pipe;

a heating device having a plurality of control zones in a vertical direction;

first partitions arranged so that the number of the plurality of control zones and the number of the plurality of zones coincide with each other, the plurality of zones being formed between the first partitions arranged on upper and lower sides; and a cooling unit configured to shift the first partition that is arranged on the upper side downward so that height of the plurality of zones is lower than height of the control zones in an upper one of the plurality of zones facing an upper one of the control zones.

11. The apparatus of claim 10, wherein the buffer is provided with second partitions provided for each of the zones, and wherein the second partitions are configured to determine a direction of the gas flowing through the buffer.

* * * * *